US010506338B2

United States Patent
Howlett

(10) Patent No.: US 10,506,338 B2
(45) Date of Patent: Dec. 10, 2019

(54) AUDIO CIRCUITRY

(71) Applicant: Cirrus Logic International Semiconductor Ltd., Edinburgh (GB)

(72) Inventor: Andrew James Howlett, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/020,027

(22) Filed: Jun. 27, 2018

(65) Prior Publication Data

US 2018/0376246 A1    Dec. 27, 2018

Related U.S. Application Data

(60) Provisional application No. 62/525,422, filed on Jun. 27, 2017.

(30) Foreign Application Priority Data

Aug. 30, 2017   (GB) .................................. 1713919.7

(51) Int. Cl.
  *H04R 3/00*    (2006.01)
  *H04R 29/00*   (2006.01)

(52) U.S. Cl.
  CPC ............. *H04R 3/007* (2013.01); *H04R 29/00* (2013.01)

(58) Field of Classification Search
  CPC ............ H04R 3/007; H04R 29/00; H03F 1/52

(Continued)

(56) References Cited

U.S. PATENT DOCUMENTS 4,006,428 A *  2/1977  Meyer ...................... H03F 1/52
                                                    330/51
4,368,436 A    1/1983  Palara et al.
(Continued)

FOREIGN PATENT DOCUMENTS

JP    H066314 A     1/1994
WO    200126222 A1  4/2001

OTHER PUBLICATIONS

Combined Search and Examination Report, UKIPO, Application No. GB1713919.7, dated Feb. 16, 2018.
(Continued)

*Primary Examiner* — David L Ton
(74) *Attorney, Agent, or Firm* — Jackson Walker L.L.P.

(57) ABSTRACT

This application relates to methods and apparatus for monitoring the operating state of an audio circuit, and in particular for detecting a defective operating state, as may occur after an Electrical Over-Stress (EOS) event. An audio circuit (210) has an input node (103) for receiving an input audio signal ($S_{IN}$) and an output node (104) for outputting an output audio signal ($A_{OUT}$) for driving an audio load. A monitoring module (202) receives a first signal ($S_1$) derived from the output audio signal and a second signal ($S_2$) indicative of the input audio signal. The monitoring module (202) monitors the first signal ($S_1$) with respect to the second signal ($S_2$) to determine whether at least one parameter of the first signal corresponds to an expected parameter value based on the indication of input audio signal. If the parameter does not correspond to the expected parameter value, the monitoring module (202) outputs an indication (CTRL) of a defective operating state of the audio circuit (201).

19 Claims, 2 Drawing Sheets

(58) Field of Classification Search
USPC .................................................. 381/58, 59
See application file for complete search history.

(56) References Cited

U.S. PATENT DOCUMENTS

| | | |
|---|---|---|
| 4,682,120 A | 7/1987 | Palara et al. |
| 8,421,540 B1 | 4/2013 | Bhattacharya |
| 2005/0093622 A1 | 5/2005 | Lee |
| 2011/0095817 A1 | 4/2011 | Yamada |
| 2016/0329867 A1 | 11/2016 | Lesso et al. |

OTHER PUBLICATIONS

International Search Report and Written Opinion of the International Searching Authority, International Application No. PCT/GB2018/051786.

* cited by examiner

AUDIO CIRCUITRY

TECHNICAL FIELD

This disclosure relates to monitoring of audio circuitry, and in particular to monitoring of an audio driver circuit to identify a defective operating state of the audio circuit, and especially to the monitoring of an audio output of an audio circuit.

BACKGROUND INFORMATION

Many electrical devices include some audio capability and thus include some audio circuitry. For example, portable electronic devices, such as smartphones or tablet computers or the like, typically include an audio circuit, such as an audio codec or the like, that can drive one or more audio transducers of the host device. Such devices may also have the ability to provide audio signals for driving an external audio load, e.g. an audio transducer of a peripheral device that may, in use, be removably connected to the device via some suitable connector, such as a jack plug and socket arrangement or some other mating connector such as a USB connector or the like. The audio circuit may therefore be connected to one or more contacts or a device connector, e.g. a jack socket, for outputting or receiving audio signals.

It has been recognised that in some cases such an audio circuit may be subject to a possible electrical overstress. Electrical overstress (EOS) refers to an electrical stimulus being applied which is greater than a rated operating range of the circuit. Electrical overstress may occur from a variety of causes, such as electrostatic discharge or power fluctuations or the like. For an audio circuit of the type described above an electrical overstress could possibly be applied via the device connector.

At least some audio circuits may include some protection circuitry designed to try to protect the circuit in the event of an applied overvoltage or overcurrent. In the event of a voltage/current surge at a contact of the audio circuit, the protection circuit may operate. In some instances the protection circuitry will operate correctly and once the surge has dissipated the audio circuit may continue to function normally. In some instances however operation of the protection circuitry may disrupt the operation of the audio circuit, leading to a temporary defective operating state or the protection circuitry may not be able to prevent damage to the audio circuit which could result in a permanent defective state.

SUMMARY OF EMBODIMENTS

Embodiments of the present invention relate to monitoring of audio circuits capable of detecting such a defective operating state.

According to the present disclosure there is provided an audio circuit comprising:
 a forward signal path between an input node for receiving an input audio signal, and an output node for outputting an output audio signal for driving an audio load; and
 a monitoring module having:
 a first input for receiving a first signal derived from the output audio signal; and
 a second input for receiving a second signal indicative of the input audio signal;
 wherein the monitoring module is configured to:
 monitor the first signal with respect to said second signal to determine whether at least one parameter of the first signal corresponds to an expected parameter value based on the indication of input audio signal; and
 output an indication of a defective operating state of the audio circuit if said monitoring module indicates that said parameter does not correspond to the expected parameter value.

In some embodiments the at least one parameter of the first signal may comprise a magnitude of the first signal. The monitoring module may comprise a comparator configured to compare the first signal to a first threshold. A monitor controller may be configured to receive the second signal and an output from the comparator. The monitor controller may be configured to determine that the magnitude of the first signal corresponds to the expected parameter value in the event that: the comparator output indicates the first signal exceeds the first threshold when the second signal indicates that the input audio signal has a non-zero magnitude; or the comparator output indicates the first signal does exceed the first threshold and the second signal indicates that the input audio signal has a magnitude of substantially zero. The monitor controller may be configured to determine that the magnitude of the first signal does not correspond to the expected parameter value in the event that the comparator output indicates the first signal does not exceed the first threshold and the second signal indicates that the input audio signal has a non-zero magnitude.

In some instances the second signal may comprises an indication of the envelope value of the input signal. In some instances the second signal may comprises an indication that the input signal has substantially zero magnitude.

In some embodiments the second signal comprises a version of the input signal.

In some embodiments the at least one parameter of the first signal may comprise an error between the first signal and the second signal. The monitoring module may comprise an error block configured to receive the first signal and the second signal and to output an error signal indicative of the error between the first and second signals. The monitoring module may comprise a monitor controller configured to receive the error signal and determine if a magnitude of the error signal exceeds an error threshold. The monitor controller may be configured to determine that the error between the first signal and the second signal corresponds to the expected parameter value when magnitude of the error signal does not exceed the error threshold. The monitor controller may be configured to determine that the error between the first signal and the second signal does not correspond to the expected parameter value when magnitude of the error signal exceeds the error threshold. In some embodiments the monitor controller may be configured to determine a level of distortion of the output audio signal based on a magnitude of the error signal. In which case the monitoring controller may be configured to output an indication of the level of distortion of the output audio signal.

In some embodiments a compensation module may be configured to receive an error signal indicative of the error between the first and second signals from the error block and may be configured to control at least one aspect of operation of the forward signal path based on the received error signal. The compensation module may be configured to modulate the input audio signal in the forward signal based on the received error signal.

Some embodiments may comprise an analogue to digital converter configured to receive a feedback signal derived from the output audio signal and generate a corresponding digital signal as said first signal. In some embodiments, where the audio circuit is implemented as an integrated circuit, the feedback signal may be derived externally from the integrated circuit.

In some examples the monitoring module may be configured to output the indication of a defective operating state by outputting a control signal. The control signal may comprise an interrupt signal. In some instances the control signal may comprise a repeating signal and the monitoring module may be configured to output the indication of a defective operating state by varying the properties of the repeating signal.

In some embodiments the monitoring module may be configured to output said indication of a defective operating state to a controller. The controller may be configured to restart the audio circuit in the event of receiving said indication of a defective operating state. Additionally or alternatively the controller may be configured to record data regarding the time and/or operating state of the audio circuit in the event of receiving said indication of a defective operating state.

Embodiments also relate to an audio apparatus comprising an audio circuit as described in any of the variants above.

The audio apparatus may comprise a first connector for removably connecting to a mating second connector of a peripheral device. The audio apparatus may be operable, in use, to supply the output audio signal to the first connector for driving an audio transducer of a connected peripheral device. The audio apparatus may comprise at least one of: a battery powered device; a portable device; a communications device; a mobile telephone; a smartphone; a computing device; a laptop; notebook or tablet computer; a gaming device; a personal media player; a wearable device; a voice controlled device.

In another aspect there is provided an audio circuit comprising:
 a forward signal path between an input node for receiving an input audio signal, and an output node for outputting an output audio signal for driving an audio load; and
 a monitoring module configured to:
 receive a first signal derived from the output audio signal,
 compare the first signal to a reference to determine whether the output audio signal corresponds to the input audio signal, and
 output an indication of a defective operating state of the audio circuit if said comparison indicates that the output signal does not correspond to the input audio signal.

In some examples the reference may be reference signal level expected when the audio circuit is outputting a non-zero output signal level. In some examples the reference may be a reference signal which may be derived from the input audio signal.

Another aspect provides a method for monitoring an audio circuit having a forward signal path between an input node for receiving an input audio signal and an output node for outputting an output audio signal, the method comprising:
 monitoring a first signal derived from the output audio signal with respect to an indication of the input audio signal;
 determining whether a parameter of the first signal corresponding to an expected parameter value based on the input audio signal; and
 in the event said parameter does not correspond to the expected parameter value, outputting an indication of a defective operating state of the audio circuit.

In a further aspect there is provided an audio circuit comprising:
 an input for receiving an input audio signal;
 an output for outputting an output audio signal for driving a transducer; and
 comparison circuitry configured to:
 receive a first signal derived from the output audio signal;
 receive a second signal derived from the input audio signal;
 compare the first and second signals to determine whether the output audio signal corresponds to the input audio signal, and
 output an indication of defective operation of the audio circuit if said comparison indicates that the output signal does not correspond to the input audio signal.

BRIEF DESCRIPTION OF THE DRAWINGS

For a better understanding of the present invention, and to show how it may be put into effect, reference will now be made, by way of example only, to the accompanying drawings, in which:—

DETAILED DESCRIPTION

The following sets forth specific details, such as particular embodiments for purposes of explanation and not limitation. It will be appreciated by one skilled in the art that other embodiments may be employed apart from these specific details. In some instances, detailed descriptions of well-known methods, nodes, interfaces, circuits, and devices are omitted so as not obscure the description with unnecessary detail.

Figure 1:
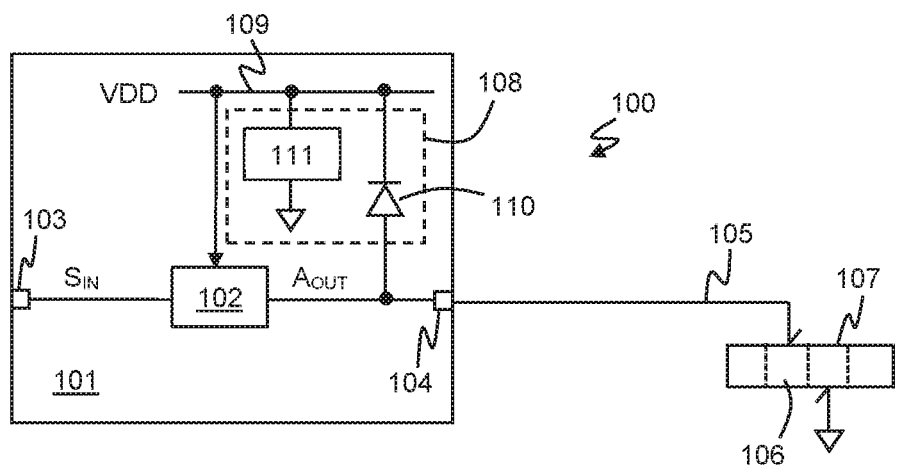
FIG. 1 illustrates one example of a typical audio circuit for driving an audio load.

FIG. 1 illustrates a generic audio circuit arrangement 100 for driving an audio load, such as a loudspeaker, with an output audio signal. An audio circuit 101, which may for example be an integrated circuit such as an audio codec or the like, may comprise a signal processing block 102 located in a forward signal path between an input node 103, for receiving an input audio signal $S_{IN}$, and an output node 104, for outputting an output audio signal $A_{OUT}$ to drive the audio load. The input node 103 could be a suitable contact of the audio circuit 101 for receiving the input audio signal, e.g. a pin or pad of the integrated circuit, or may be any suitable node of a signal path of the circuit, for instance the output of some upstream processing block. The input audio signal $S_{IN}$ may conveniently be a digital signal. The signal processing block 102 may typically comprise at least one amplifier stage and, depending on the type of amplifier, may include a DAC (digital-to-analogue converter) to convert a digital input audio signal into an analogue signal for amplification. In some instances, the signal processing block 102 may comprise an amplifier, such as a class-D amplifier, that operates with digital inputs.

The output audio signal $A_{OUT}$ is output from the audio circuit 101 via output node 104, for example an output pin of the codec, and propagated from the output node 104 to the relevant audio load via an audio signal path 105. Where the audio driving circuit 101 is formed as an integrated circuit, i.e. on a chip, the signal path 105 will be at least partly, if not wholly, external to the integrated circuit, i.e. off-chip, and may, for example, be at least partly formed on a circuit board of the host device, i.e. the device within which the audio driving circuit 101 is located.

In some instances the audio circuit 101 may be used to drive an audio transducer, e.g. loudspeaker, of an apparatus which is external to the host device, for instance an accessory apparatus, such as a headset, that may be removably connected to the host device, in use, for transfer of audio signals. The signal path 105 may thus connect, in use, the output terminal 104 of the audio driving circuit 101 to a suitable contact 106 of a connector 107 of the host device. Another suitable contact of the connector 107 may be connected to ground.

The connector 107 may be any suitable connector for making a connection with an external apparatus. The connector may for example be a socket for making a mating connection with a corresponding plug, such as part of a TRS or TRRS jack plug and socket arrangement, or may be some other suitable receptacle such as part of a USB plug and socket arrangement or similar, which in some cases may be a reversibly symmetrical plug and socket arrangement.

The signal path 105 from contact 106 of the connector 107 thus represents a possible conductive path for application of electrical overstress to the audio circuit via output node 104. In use an electrical stimulus which is above the normal operating range for the audio path could be applied to the contact 106. Such an electrical overstress could arise for a variety of reasons, for instance from an electrostatic discharge or a faulty accessory apparatus. In some instances an electrical overstress may be applied accidentally or deliberately by connecting the contact to an electrical power source in an inappropriate way, e.g. through use of an inappropriate accessory.

The audio circuit may thus include some protection circuitry 108 designed to try to protect the circuit in the event of an electrical surge. For example the output node 104, e.g. a contact such as a pad or pin, of the audio circuit 101 may be coupled to at least one supply rail, for instance a VDD supply rail 109, via at least one diode 110. The diode(s) 110 are arranged so as to be reverse biased in normal operation, so as to be normally non-conducting. In the event of an overvoltage at the output node 104 the diode 110 becomes forward biased and provides a path to the supply rail 109. The supply rail 109 itself may be connected to a clamp circuit 111 that operates to try to limit the voltage of the supply rail in the event of current/voltage surge and which may operate to connect the supply rail 109 to ground in the event of an overvoltage surge. The operation of a clamp circuit will be well understood by one skilled in the art.

In the event of a voltage/current surge at the output node 104 of the audio circuit 101 various things may happen, depending on the polarity of the surge. If the surge leads to an overvoltage then the protection circuitry 108 may operate for the relevant supply rail to try to limit the overvoltage. This could result in a rise in voltage of the supply rail, e.g. supply rail 109. If the audio circuit 101 is operational and the surge leads to an under-voltage the circuit components may attempt to source or sink may current to maintain the desired voltage at the output node, which could cause droop of a supply rail. Depending on the polarity of the surge the voltage of a supply rail may thus rise or fall.

In some instances the extent of any rise/fall of supply voltage may be limited and the audio circuit 101 may remain operational. For an overvoltage the protection circuitry 108 may limit the extent of any overvoltage. Once the surge has dissipated the audio circuit 101 may continue to function normally. However in some instances a sufficient rise in supply voltage or fall ("brown-out") of supply voltage could result in malfunction of the audio circuit 101. In some instances the protection circuit may be insufficient to prevent electrical overstress and excess voltage/current in the audio signal path could cause damage to the forward signal path, e.g. to an amplifier or other components of signal processing block 102.

It has been proposed that a contact of the audio circuit 101, such as output node 104, could be monitored to detect the occurrence of an EOS (electrical over stress) event. However detection of an EOS event may simply indicate that an EOS event occurred. Any effect of the EOS event on the operating state of the audio circuit 101 may not be known, in particular it may not be known whether the audio circuit 101 has suffered permanent damage or is in a temporary defective state or is operating normally.

Embodiments described herein relate to methods and apparatus for monitoring an operating state of the audio circuit. Embodiments described herein allow for monitoring of whether the audio circuit is functioning as expected, or whether some event has occurred resulting in a defective operating state. For example, if the audio circuit is operating in a defective output state the audio circuit may not be outputting an audio output signal corresponding to the input audio signal. In some instances the forward signal path may cease functioning so that no output audio signal $A_{OUT}$ at all is produced at a time when an input signal $S_{IN}$ is being received (and not deliberately muted). In some instances an output audio signal may be produced but the output audio signal may be significantly distorted in an undesired way.

Figure 2:
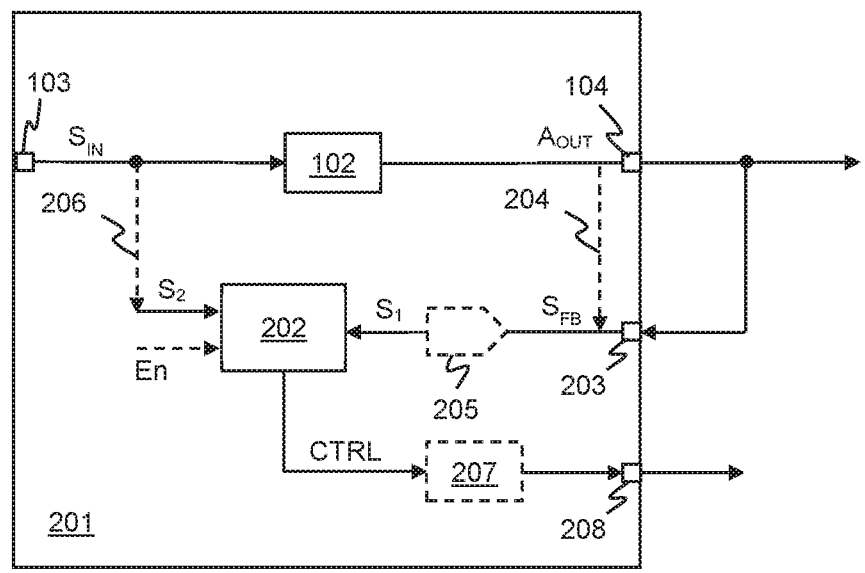
FIG. 2 illustrates an audio circuit for driving an audio load according to some embodiments.

FIG. 2 illustrates an audio circuit 201 for driving an audio load according to an embodiment in which similar components to those described in FIG. 1 are identified by similar reference numerals. The audio circuit 201 may be an integrated circuit, such as an audio codec or the like. Within a host device the audio circuit 201 may be arranged to drive an audio load such as an audio transducer, e.g. loudspeaker or the like, of the host device and/or may be capable of outputting an output audio signal $A_{OUT}$ to a suitable contact of a device connector to drive an audio load of a connected accessory apparatus, e.g. a headset or similar, in a similar manner as described above with reference to FIG. 1.

The audio circuit 201 has a forward signal path between an input node 103 for receiving an input audio signal $S_{IN}$ and an output node 104 for outputting the output audio signal $A_{OUT}$. The forward signal path between the input node 103 and the output node 104 may comprise a first signal processing block 102 for generating the output audio signal $A_{OUT}$. Typically the input signal $S_{IN}$ may be a digital signal and the audio output signal $A_{OUT}$ may be an analogue signal. The first signal processing block 102 may thus comprise some form of digital to analogue convertor (DAC). The signal processing block 102 may also comprise at least one amplifier stage. In some instances the amplifier could be a Class-D type amplifier able to receive a digital input signal $S_{IN}$ and produce an audio output signal $A_{OUT}$ that, with suitable filtering in the downstream signal path, provide an analogue driving signal for driving the audio load.

In embodiments of the present disclosure the audio circuit 201 further comprises a monitoring module 202 for monitoring the operating state of the audio signal path. The monitoring module 202 has a first input for receiving a first signal $S_1$ derived from the output audio signal, $A_{OUT}$, and a second input for receiving a second signal $S_2$, which is an indication of the input signal $S_{IN}$.

The monitoring module 202 thus receives a signal $S_1$ derived from the output audio signal $A_{OUT}$ which is output from the audio circuit 201 and also an indication $S_2$ of the input signal $S_{IN}$ and, from these two signals, determines whether at least one parameter of the output signal $A_{OUT}$ is as expected, given the input signal $S_{IN}$. If the relevant parameter is as expected, i.e. is within an expected range for the relevant parameter, then the audio circuit 201 may be determined to be operating satisfactorily. If however the relevant parameter is not as expected, then this can indicate a defective operating state. If the monitoring module 202 determines that the relevant parameter is not as expected, the monitoring module 202 may output an indication, i.e. a control signal CTRL, indicating that the audio circuit is operating in a defective operating state.

In some instances a relevant parameter may be a signal level of the output audio signal $A_{OUT}$. For instance the monitoring module 202 may determine that there is indeed an output audio signal $A_{OUT}$ at the appropriate signal level when one is expected. Additionally or alternatively a relevant parameter may be an indication of any error between the input signal $S_{IN}$ and the output signal $A_{OUT}$, which may indicate whether the output audio signal $A_{OUT}$ is distorted in some way which is greater than would be expected. Further details of relevant parameters and how they may be determined are described below.

The first signal $S_1$ received by the monitoring module is derived from the output audio signal $A_{OUT}$. In some embodiments, where the audio circuit 201 is an integrated circuit, a feedback signal $S_{FB}$ may be tapped from the signal path downstream of the output node 104, i.e. from the off-chip signal path, for example downstream of any off-chip filter components (not illustrated). The feedback signal $S_{FB}$ may be brought back on-chip via a suitable contact 203 of the audio circuit. In some embodiments tapping the feedback signal $S_{FB}$ from the off-chip signal path may advantageously provide a better indication of the driving signal which is applied to the audio load. This does however require an additional circuit contact 203, e.g. pin, which may be undesirable in some instances. Alternatively the feedback signal $S_{FB}$ could be tapped from the audio circuit path as indicated by path 204.

In some instances the feedback signal $S_{FB}$ may be used directly as the first signal $S_1$ supplied to the monitoring module 202. In other instances the feedback signal $S_{FB}$ may be input to an analogue-to-digital converter (ADC) 205 to generate a digital signal $S_1$ as the first signal. It will be understood that there could, in some instances, there could be other components such as level shifters or filters etc. in the analogue and/or (if appropriate) digital path of the feedback path.

The monitoring module 202 also receives a second signal $S_2$ which is an indication of the input signal $S_{IN}$. In some instances, for example where the monitoring module 202 simply determines that there is some output audio signal $A_{OUT}$ when expected, the indication $S_2$ of the input signal may simply be an indication that a non-zero input signal is being received. This could be determined by some other part of the audio circuit 201 or some upstream circuitry. For instance, for various reasons an envelope value for the input signal $S_{IN}$ may be available and/or there may be a low-level detector to detect low-level parts of the input signal. The second signal $S_2$ could, in such cases, be an indication of the envelope value or an indication that a low-level part of the signal has not been detected and which is received from some other functional module.

In some embodiments however a version of the input signal $S_{IN}$ itself may be supplied to the monitoring module as the second signal $S_2$, e.g. via signal path 206.

As mentioned the monitoring module 202 thus monitors the first signal $S_1$ with respect to said indication of the input audio signal, i.e. second signal $S_2$, to determine whether a first parameter of the first signal $S_1$ corresponds to an expected parameter value based on the indication of the input audio signal. If not the monitoring module 202 may determine that a fault has occurred and output a control signal CTRL indicating that the audio circuit, or at least the part of the audio circuit monitored by the monitoring module 202, is in a defective state.

The control signal CTRL may be passed to one or more control modules to take appropriate action. One control module 207 could be part of the audio circuit 201. The control module 207 could receive the control signal CTRL and try to rectify the situation, for instance by restarting the audio circuit 201 or the relevant defective part thereof. Additionally or alternatively in some implementations a control signal may be provided to some external module, i.e. off-chip, via a suitable contact 208. For example an indication that the audio circuit 101 is defective may be supplied to an applications processor of a host device. The applications processor may take any appropriate action, such as logging the fault in memory and initiating a restart of restarting the audio circuit 201.

The monitoring module 202 may be enabled to monitor the operation of the audio circuit 201 any time that the audio circuit 201 is operational. The monitoring module may operate continuously and generate an alert if a defective operating state is detected or may operate periodically at intervals. In some instances the monitoring module 202 may, in particular, be configured to be enabled by an enabling signal En, which may, in particular, be asserted in the event that an EOS event is detected by some EOS monitoring circuitry (not shown). In this way the operating state of the audio circuit 201 can be determined by the monitoring module 202 following detection of an EOS event.

As discussed above, in some embodiments the first parameter of the first signal $S_1$ which is monitored by the monitoring module 202 may be the magnitude of the first signal. In some embodiments the monitoring module 202 may be arranged to monitor whether there is an output audio signal $A_{OUT}$ when a signal is expected. If the signal magnitude of the output audio signal $A_{OUT}$ is above some minimum value this indicates that the forward signal path is functioning and there is an output audio signal $A_{OUT}$.

Figure 3:
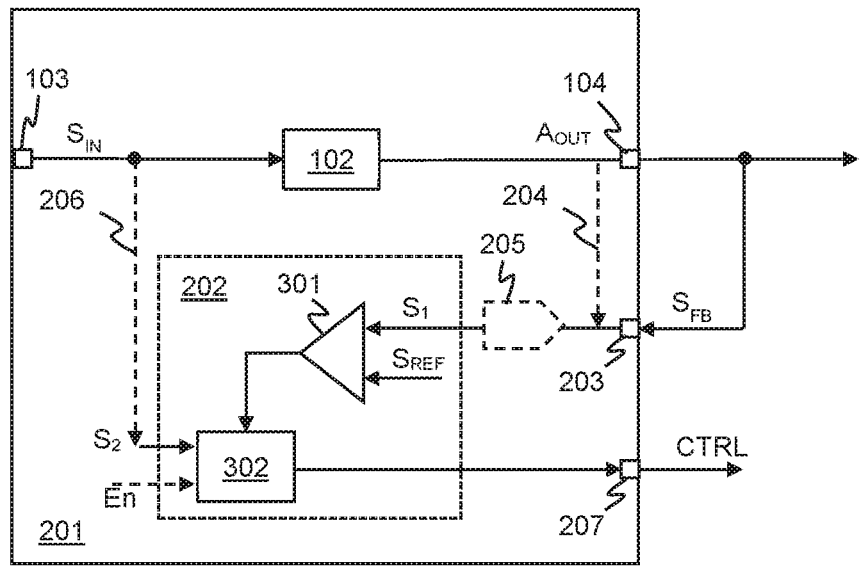
FIG. 3 illustrates one example of an audio circuit for driving an audio load in more detail.

FIG. 3 illustrates an embodiment suitable for monitoring the signal level of the first signal. FIG. 3 illustrates an audio circuit 201 in which similar components to those described above are identified by the same reference numerals.

In the example illustrated in FIG. 3 the monitoring module 202 comprises a comparator 301 which is configured to receive the first signal $S_1$ and compare the first signal to a reference $S_{REF}$. The comparator is configured to compare the first signal $S_1$ to the reference $S_{REF}$ to determine whether the magnitude of the first signal $S_1$ is greater than the reference $S_{REF}$. The reference $S_{REF}$ is selected to correspond to a magnitude of the first signal $S_1$ that will distinguish between instances of a non-zero magnitude output signal and no output signal. The reference may be set above zero to allow for noise etc. that may be present in the signal path even in the absence of an output audio signal $A_{OUT}$. In other words the reference $S_{REF}$ is defined so that an instance of no audio output signal $A_{OUT}$ would not be expected to result in the magnitude of the first signal $S_1$ exceeding the threshold, but that any significant signal level of audio output signal $A_{OUT}$ would cross the threshold.

Thus, if a non-zero audio output signal $A_{OUT}$ is being output by the audio circuit 201 it would be expected that the first signal $S_1$ would regularly exceed the threshold defined by $S_{REF}$. If the magnitude of the first signal $S_1$ remains below the threshold defined by the reference $S_{REF}$ then this indicates that either no output audio signal $A_{OUT}$ is being output or that the output audio signal $A_{OUT}$ has a very low level, i.e. substantially zero, magnitude. The comparator 301 may thus be effectively configured to act as an activity detector with a sensitivity threshold defined by $S_{REF}$.

It will be appreciated however an output signal level of zero magnitude does not necessarily indicate a fault, as an output audio signal of zero magnitude would be expected in normal operation during periods of silence in the input audio signal $S_{IN}$. The monitoring module 202 thus receives the second signal $S_2$ which is an indication of the input signal $S_{IN}$ and which, in this instance, may simply be an indication that the level of the input signal $S_{IN}$ is above some threshold.

A monitor controller 302 may receive the output of the comparator 301 and also the second signal $S_2$, indicative of the input signal $S_{IN}$. If the output of the comparator 301 indicates that the magnitude of the first signal $S_1$ remains below the threshold defined by $S_{REF}$ for some period of time (e.g. to avoid triggering on zero crossings) and the second signal $S_2$ indicates that the input signal is non-zero, then this indicates that the monitored parameter of the first signal, i.e. the signal magnitude, is not as expected and the audio circuit 201 is in a defective state. The monitor controller 302 may thus generate a control signal CTRL indicating that the audio circuit 201 is in a defective state.

In the example illustrated in FIG. 3 an analogue feedback signal $S_{FB}$ may be used as the first signal $S_1$ and the comparator 301 may be an analogue comparator. In which case the reference $S_{REF}$ may comprise a defined voltage reference and the comparator 301 may be a window comparator so as to effectively compare the magnitude of the first signal $S_1$ to the reference $S_{REF}$. In other embodiments however the feedback signal $S_{FB}$ could be converted to digital by an ADC 205 as described with reference to FIG. 2, in which case the absolute value of the first signal $S_1$ may be compared to a digital reference value by a digital comparator. It will be understood however that any type of activity detector may be used to determine the presence or absence of an audio output signal $A_{OUT}$.

In this example the second signal $S_2$, i.e. the indication of the input signal $S_{IN}$, may, as mentioned above, simply be an indication of an envelope value for the input signal $S_{IN}$ or a negative indication from a low-level detector that is determined elsewhere. If the input signal $S_{IN}$ itself is supplied as the second signal $S_2$, the monitor controller may determine an envelope value for the second signal or detect when the input signal corresponds to a zero-magnitude signal for a period of time.

A comparator 301 and simple monitor controller 302 may be implemented by relatively small circuitry and so would not add much in terms of size and hence cost to the audio circuit 201. At least some parts of the monitoring module 202 could be multiplexed between multiple different signal paths, e.g. for left and right audio, to monitor the signal paths. For instance the input to comparator 301 could be time multiplexed between feedback signals from the various different signal paths, with the monitor controller configured to receive an indication of the input signal for each relevant signal path.

It will be appreciated that other methods of determining whether the presence of signal of a significant amplitude is expected in the output audio signal, based on the amplitude of the input audio signal may be used to determine whether the audio circuit 201 is in a defective operating state.

The monitoring module 202 of the example of FIG. 3 can thus effectively monitor whether there is actually an audio output signal $A_{OUT}$ of substantially non-zero magnitudes at times when such an output audio signal is expected, given the indication of the input signal $S_{IN}$. This may indicate that the relevant audio signal path has stopped working completely, for instance following a brown-out of the power supply.

As noted previously however it is possible that the audio circuit 201 may continue to function and produce an output audio signal $A_{OUT}$ but the output audio signal $A_{OUT}$ may be significantly degraded or distorted due to failure or defective operation of some part of the signal path, e.g. as a result of damage caused by an EOS event. In some embodiments the monitoring module 202 may be arranged to determine whether any output audio signal $A_{OUT}$ is significantly degraded from the expected output signal, given the input signal $S_{IN}$. In some embodiments therefore the monitoring module 202 may be configured to determine when an output audio signal $A_{OUT}$ is generated but exhibits a distortion which is worse than expected in normal operation. The first parameter of the first signal $S_1$ monitored by the monitoring module may therefore be the signal level compared to an expected signal level, based on the input signal $S_{IN}$. In other words the first parameter may be the error between the first signal $S_1$ and the second signal $S_2$ and if the error exceeds a certain expected range the monitoring module 202 may determine that the audio circuit 201 is operating in a defective operating state and generate a control signal as appropriate.

Figure 4:
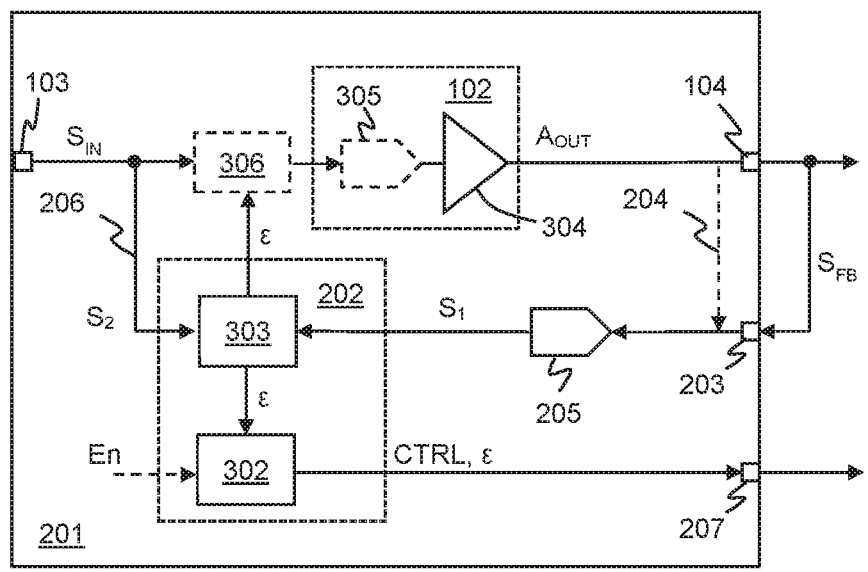
FIG. 4 illustrates another example of an audio circuit for driving an audio load.

FIG. 4 illustrates an audio circuit 201 having a monitoring module 202 according to a further embodiment. Again similar components are identified by similar reference numerals.

In the example of FIG. 4 the monitoring module 202 receives the first signal $S_1$ derived from the output audio signal $A_{OUT}$ and effectively determines an indication of error between the first signal $S_1$ and the second signal $S_2$. Conveniently as much of the audio circuit 201 is digital as is possible and thus the first signal $S_1$ may be a digital signal produced by ADC 205 that receives the feedback signal $A_{OUT}$. In this example the second signal $S_2$ supplied to the monitoring module is thus a version of the input signal $S_{IN}$.

The monitoring module 202 is configured to monitor the signal level of first signal $S_1$ compared to the signal level of the input signal $S_2$ to determine if the actual signal level of the first signal $S_1$, indicative of the audio output signal $A_{OUT}$, is sufficiently close to an expected signal level, given the input signal and allowing for a certain tolerance in normal operation. In the example of FIG. 4, the monitoring module 202 comprises an error block 303 arranged to receive the first and second signals $S_1$ and $S_2$ and to output a first error signal E indicative of the error between these signals. A monitor controller 302 may be configured to receive the error signal E indicative of any error between the first and second signals $S_1$ and $S_2$, and hence any error between the input signal $S_{IN}$ and output audio signal $A_{OUT}$, and determine whether the error signal E indicates that the error is within an expected operating range.

It will be understood that in practice some distortion in the forward signal path of the audio circuit 201 and/or downstream signal path may be inevitable. For instance as illustrated in FIG. 4 the signal processing block 102 may comprise an amplifier 304 and possibly a digital-to-analogue converter (DAC) 305. There may be some inherent distortion associated with the amplifier 304 and/or DAC 305 which would, even in normal, non-defective, operation of the audio circuit 201 result in some mismatch between the input audio signal $S_{IN}$ and the output audio signal $A_{OUT}$. Such inherent distortion may however be designed to be within an expected range and thus the error E between the first and second signals $S_1$ and $S_2$ may be expected to be with a first range, e.g. below a defined threshold, in normal non-defective operation.

If however some damage to the signal path occurs or some components of the signal path such as amplifier 304 or DAC 305 cease to operate correctly, the output audio signal $A_{OUT}$ may become significantly more distorted and thus the error E may increase beyond the defined threshold.

The monitoring module 202 may thus be configured to determine that the first parameter of the first signal is as expected when the magnitude of the error signal E is below a defined error threshold. If, however, the magnitude of the error signal E exceeds the error threshold, this may be taken as an indication that the audio circuit 201 is in a defective operating state and the monitor controller 302 may generate a control signal CTRL as appropriate. The error threshold can be set based on an expected amount of acceptable error in normal operation. In some instances the monitor controller 302 may be arranged to determine any time the error signal E exceeds the error threshold. However it may be possible that short periods of higher levels of error may occur in normal operation. The monitor controller 302 may thus be configured to determine whether the error threshold is consistently exceeded, e.g. for a certain period of time or proportion of time.

In some embodiments the error threshold may be fixed. However it will be appreciated that the expected error in normal non-defective operation may be greater for higher amplitude signals than for lower amplitude signals. Thus in some embodiments the expected error threshold may be scaled with an indication of amplitude of the input audio signal $S_{IN}$ or output audio signal $A_{OUT}$.

It will be appreciated that any gain or other expected transfer characteristic in the forward signal path, e.g. an amplifier gain applied by amplifier 304, should be taken into account in determining the error signal E. Thus the error block 303 may be configured to apply some processing to at least one of the received first or second signals $S_1$ or $S_2$ before determining the error, such that the error signal E is indicative of unwanted distortion affecting the output audio signal $A_{OUT}$.

As mentioned the monitor controller 302 may monitor the error signal E against an error threshold and generate a control signal CTRL indicating that audio circuit 201 is a defective state if the error signal E exceeds the error threshold in a defined way. In some instances the control signal may simply be some sort of flag that the audio circuit is in a defective state. However in some instances the monitor controller 302 may be configured to input an indication of the severity of the error, for instance by comparing the error threshold to a plurality of different error thresholds or by outputting an indication of the error signal E.

In some instances an error signal E indicative of the error between an input audio signal $S_{IN}$ and the output audio signal $A_{OUT}$ may be useful for the audio circuit 201 for other reasons. As mentioned the error signal E can be indicative of unwanted distortion in the forward signal path (or downstream signal path for the output audio signal $A_{OUT}$ depending on where the feedback signal $S_{FB}$ is tapped from). Such an error signal E may be useful for adapting or controlling some aspect of the forward signal path to maintain a desired level of performance. In some embodiments an error signal $\varepsilon_1$ from the error block may also be to a compensation module 306. The error signal $\varepsilon_1$ may conveniently be effectively the same error signal E as output to monitor controller 302, although in some instances there could be different processing applied by the error block 303. The compensation module 306 may be configured to modulate the input signal $S_{IN}$ in the forward signal path in some fashion to attempt to minimise the error $\varepsilon_1$, i.e. to compensate for the downstream distortion. There are various ways that a compensation module 306 could modulate the input signal $S_{IN}$ to reduce or minimise distortion as will be understood by one skilled in the art.

In such a case the feedback path for providing a feedback signal $S_{FB}$ and ADC 205 and error block 303 may thus also be used for other purposes, e.g. as part of a feedback distortion control arrangement, i.e. these components may have a shared purpose in embodiments of the disclosure. Some audio circuit designs may thus include an ADC 205 and error block 303 for the reasons of maintaining/improving performance in normal non-defective operation. In such an audio circuit design implementing a monitoring module 202 may therefore require only a monitor controller 302, in terms of additional components over what might otherwise be provided. In other words the monitoring module may make use of or re-use components that are provided for other reasons and thus may require a limited amount of dedicated components to provide the monitoring functionality. Again therefore the size and cost associated with implementing a monitoring module may be relatively low.

Embodiments of the disclosure thus provide a means for monitoring an audio circuit 201 to determine if the audio circuit is operating in a defective state. Embodiments may particularly be suited to determining the operating state of an audio event after an EOS event. In some embodiments therefore detection of an EOS event, via some other means, may be used to trigger the monitoring module 202 to determine an operating state for the audio circuit. In some embodiments however the monitoring module 202 may continuously or periodically determine the operating state of the audio circuit 201 as part of a self-test or health monitoring arrangement. Although described in relation to EOS events the same principles would equal detect any significant degradation that results in a defective operating state.

In the event that a defective operating state is detected the monitoring module 202 may generate an alert in any one or more of a number of different ways. For instance the control signal CTRL generated by the monitoring module 202, e.g. by monitor controller 302, may be an interrupt type signal for a controller 207 of the audio circuit 201 or some external controller, such as an applications processor of a host device. In some instances the control signal CTRL could be a period signal that is produced regularly in normal operation and which is changed in some way, e.g. paused or halted, when a defective operating state is detected, e.g. the control signal may be a heartbeat type signal for signalling normal operation. In some instances the monitoring module 202 may also output other information indicative of the severity of the faulted operation, e.g. an indication of the level of error E.

On receipt of the indication of a defective operating state the relevant controller, e.g. 207, may take a number of actions. The controller may pause audio to the relevant signal path, possibly redirecting to another signal path if possible. The controller may try to restart the audio circuit or relevant part thereof. The controller may also log data regarding the time that the defective state was detected and information about the severity of the fault. This may be useful for a device manufacturer in terms of analysing returned devices.

It will be appreciated that the embodiments of FIGS. 3 and 4 have been described as separate embodiments. However aspects of these embodiments may be combined. For instance a monitoring module 202 may implement both approaches or there may be more than one monitoring module for monitoring a given signal path. In some instances some signal paths of an audio circuit, where distortion quality may not be important, e.g. a signal path for driving a haptic transducer, may be monitored by a monitoring module as illustrated in FIG. 3 whilst other signal paths, e.g. an audio signal path for driving a loudspeaker, may be monitored using the embodiment of FIG. 4.

Audio circuit according to embodiments may be used within an audio apparatus. The audio apparatus may further comprise a first connector for removably connecting to a mating second connector of a peripheral device. The audio apparatus may be operable, in use, to supply the output audio signal to the first connector, for example for driving an audio load, such as a transducer of a connected peripheral device. The audio load could be a single-ended load with a return to ground. It will of course be appreciated that the output could be an H-bridge type arrangement.

The audio apparatus may be at least one of: a battery powered device; a portable device; a communications device; a mobile telephone; a smartphone; a computing device; a laptop; notebook or tablet computer; a gaming device; a personal media player; a wearable device; a voice controlled device.

There is therefore provided methods and apparatus for monitoring the operating state of an audio circuit. In particular, there is described embodiments which allow for the monitoring of EOS events and whether an audio circuit is operating in a defective state following an EOS event.

Embodiments have been described with reference to an audio circuit with a signal path for driving an audio load, which may be a transducer of an external device. It will be understood that the transducer may however be a transducer of a host device that comprises the audio driving circuit. The audio circuit may also include signal paths for receiving audio signals from a transducer such as a microphone, which may be a microphone of a host device or a connected accessory.

It should be noted that as used herein the term audio shall not be restricted to audible frequencies and can include signals at other frequencies, in particular the term audio as used herein shall be taken to include reference to ultrasonic frequencies. The audio load may be a transducer and may be any type of transducer for converting an analogue audio signal to a suitable pressure/vibration wave. The audio load may for instance comprise an audio transducer suitable for sound reproduction, for instance a loudspeaker, which could be a speaker of a host device or a headphone or earbud speaker of a suitable accessory. The transducer may be an ultrasonic transducer. The transducer could be a haptic transducer and the term audio driving signal shall be taken to include a driving signal for a haptic transducer. The principles of the disclosure would also be applicable to amplification of other types of non-audio signal.

Note that as used herein the terms 'module' and 'block' shall both be used to refer to a functional unit for performing the stated function. A module or block may be implemented at least partly by dedicated hardware components such as custom defined circuitry and/or at least partly be implemented by one or more software processors or appropriate code running on a suitable general purpose processor or the like. The appropriate code may be stored in memory in the host device. It should also be noted that any components forming part of one module or block may be shared with another module or block and/or the same processor may implement multiple modules or blocks and may already be performing other control or data processing, which include other processing of the audio signal, e.g. pre-conditioning of the audio signal data stream.

The skilled person will thus recognise that some aspects of the above described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communications with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

The invention claimed is:

1. An audio circuit comprising:
a forward signal path between an input node for receiving an input audio signal, and an output node for outputting an output audio signal for driving an audio load; and
a monitoring module having:
a first input for receiving a first signal derived from the output audio signal; and
a second input for receiving a second signal indicative of the input audio signal;
wherein the monitoring module is configured to:
monitor the first signal with respect to said second signal to determine whether at least one parameter of the first signal corresponds to an expected parameter value based on the indication of input audio signal; and output an indication of a defective operating state of the audio circuit if said monitoring module indicates that said parameter does not correspond to the expected parameter value;

wherein said at least one parameter of the first signal comprises a magnitude of the first signal, and the monitoring module comprises a comparator configured to compare the first signal to a first threshold and a monitor controller configured to receive an output from the comparator and said second signal.

2. An audio circuit as claimed in claim 1 wherein the monitor controller is configured to determine that the magnitude of the first signal corresponds to the expected parameter value in the event that:

the comparator output indicates the first signal exceeds the first threshold when said second signal indicates that the input audio signal has a non-zero magnitude; or the comparator output indicates the first signal does exceed the first threshold and said second signal indicates that the input audio signal has a magnitude of substantially zero, or wherein the monitor controller is configured to determine that the magnitude of the first signal does not correspond to the expected parameter value in the event that the comparator output indicates the first signal does not exceed the first threshold and said second signal indicates that the input audio signal has a non-zero magnitude.

3. An audio circuit as claimed in claim 1 wherein the second signal comprises one of:

an indication of the envelope value of the input signal;
an indication that the input signal has substantially zero magnitude; and
a version of the input signal.

4. An audio circuit as claimed in claim 3 wherein said at least one parameter of the first signal comprises an error between the first signal and the second signal.

5. An audio circuit as claimed in claim 4 wherein the monitoring module comprises an error block configured to receive the first signal and the second signal and to output an error signal indicative of the error between the first and second signals.

6. An audio circuit as claimed in claim 5 further comprising a compensation module configured to receive an error signal indicative of the error between the first and second signals from the error block and configured to control at least one aspect of operation of the forward signal path based on the received error signal.

7. An audio circuit as claimed in claim 6 wherein the compensation module is configured to modulate the input audio signal in the forward signal based on the received error signal.

8. An audio circuit as claimed in claim 4 wherein the monitoring module comprises a monitor controller configured to receive the error signal and determine if a magnitude of the error signal exceeds an error threshold, wherein the monitor controller is configured to determine that said error between the first signal and the second signal corresponds to the expected parameter value when the magnitude of the error signal does not exceed the error threshold and wherein the monitor controller is configured to determine that the error between the first signal and the second signal does not correspond to the expected parameter value when the magnitude of the error signal exceeds the error threshold.

9. An audio circuit as claimed in claim 8 wherein the monitor controller is configured to determine a level of distortion of the output audio signal based on a magnitude of the error signal.

10. An audio circuit as claimed in claim 9 wherein the monitor controller is configured to output an indication of the level of distortion of the output audio signal.

11. An audio circuit as claimed in claim 1 comprising an analogue to digital converter configured to receive a feedback signal derived from the output audio signal and generate a corresponding digital signal as said first signal.

12. An audio circuit as claimed in claim 11 wherein the audio circuit is implemented as an integrated circuit and the feedback signal is derived externally from the integrated circuit.

13. An audio circuit as claimed in claim 1 wherein the monitoring module is configured to output said indication of a defective operating state by outputting a control signal, wherein said control signal comprises an interrupt signal or a repeating signal and wherein the monitoring module is configured to output said indication of a defective operating state by varying the properties of the repeating signal.

14. An audio circuit as claimed in claim 1 where the monitoring module is configured to output said indication of a defective operating state to a controller, and wherein said controller is configured to:

restart the audio circuit in the event of receiving said indication of a defective operating state; and/or
record data regarding the time and/or operating state of the audio circuit in the event of receiving said indication of a defective operating state.

15. An audio apparatus comprising an audio circuit as claimed in claim 1.

16. An audio apparatus as claimed in claim 15 further comprising a first connector for removably connecting to a mating second connector of a peripheral device wherein the audio apparatus is operable, in use, to supply the output audio signal to the first connector for driving an audio transducer of a connected peripheral device.

17. An audio apparatus as claimed in claim 15 wherein the audio apparatus comprises at least one of: a battery powered device; a portable device; a communications device; a mobile telephone; a smartphone; a computing device; a laptop, notebook or tablet computer; a gaming device; a personal media player; a wearable device; a voice controlled device.

18. An audio circuit comprising:
a forward signal path between an input node for receiving an input audio signal, and an output node for outputting an output audio signal for driving an audio load; and
a monitoring module configured to:
receive a first signal derived from the output audio signal,
compare the first signal to a reference to determine whether the output audio signal corresponds to the input audio signal, and
output an indication of a defective operating state of the audio circuit if said comparison indicates that the output signal does not correspond to the input audio signal;

wherein the monitoring module comprises a comparator configured to compare the first signal to said reference and a monitor controller configured to receive an output from the comparator and a second signal indicative of the input audio signal.

19. A method for monitoring an audio circuit having a forward signal path between an input node for receiving an input audio signal and an output node for outputting an output audio signal, the method comprising:
- monitoring a first signal derived from the output audio signal with respect to an indication of the input audio signal;
- determining whether a parameter of the first signal corresponds to an expected parameter value based on the input audio signal; and
- in the event said parameter does not correspond to the expected parameter value, outputting an indication of a defective operating state of the audio circuit;
- wherein said parameter of the first signal comprises a magnitude of the first signal, and wherein said monitoring comprises comparing the first signal to a first threshold and providing a result of the comparison and the input audio signal to a monitor controller.

* * * * *